United States Patent [19]

Brewer et al.

[11] Patent Number: 5,255,324
[45] Date of Patent: Oct. 19, 1993

[54] DIGITALLY CONTROLLED AUDIO AMPLIFIER WITH VOLTAGE LIMITING

[75] Inventors: James E. Brewer, Canton; Peter S. Abowd, Farmington Hills, both of Mich.; Frank W. Raffaeli, Parma, Ohio

[73] Assignee: Ford Motor Company, Dearborn, Mich.

[21] Appl. No.: 633,919

[22] Filed: Dec. 26, 1990

[51] Int. Cl.⁵ ............... H03G 3/00; H03G 11/00; H03G 9/00
[52] U.S. Cl. ..................... 381/107; 381/55; 381/102; 381/108
[58] Field of Search ............. 381/98, 101, 102, 104, 381/106, 107, 108, 55, 86; 330/127, 129, 138, 279, 280

[56] References Cited

U.S. PATENT DOCUMENTS

| | | | |
|---|---|---|---|
| 3,518,566 | 11/1968 | Vogel . | |
| 3,576,449 | 4/1971 | Howell . | |
| 4,048,573 | 9/1977 | Evans et al. . | |
| 4,233,566 | 11/1980 | Nestorovic . | |
| 4,318,053 | 3/1982 | Sondermeyer . | |
| 4,398,061 | 8/1983 | McMann, Jr. | 381/94 |
| 4,581,589 | 4/1986 | Ikoma . | |
| 4,646,150 | 2/1987 | Robbins | 381/1 |
| 4,794,343 | 12/1988 | Yang | 330/129 |
| 4,843,626 | 6/1989 | Werrbach . | |
| 4,912,424 | 3/1990 | Nicola et al. . | |
| 4,978,926 | 12/1990 | Zerod | 330/279 |
| 4,982,435 | 1/1991 | Kato | 381/102 |
| 4,991,218 | 2/1991 | Kramer | 381/61 |
| 5,010,306 | 4/1991 | Kutzavitch et al. | 381/109 |
| 5,042,070 | 8/1991 | Linna et al. | 381/109 |

OTHER PUBLICATIONS

Noble et al, J. Audio Eng. Soc., vol. 17, No. 6 (Dec. 1969).
TDA7360 Data Sheet.
TDA7302 Data Sheet.

Primary Examiner—James L. Dwyer
Assistant Examiner—Jack Chiang
Attorney, Agent, or Firm—Mark Mollon; Roger L. May

[57] ABSTRACT

An audio system employs a microcontroller to supervise the operation of an audio system including a digitally controlled audio processor which controls at least a wideband and a narrowband gain for the audio signal. The narrowband gain may preferably comprise a bass boost to the audio signal. Clipping distortion of the audio signal is avoided by sensing clipping in a power amplifier and reducing the digital commands for the wideband gain and the narrowband gain according to a method which reduces narrowband gain in preference to the wideband gain. After the narrowband gain is reduced to a predetermined gain, the wideband gain may be reduced if clipping persists. When clipping ceases, the narrowband gain is likewise restored to its original gain in preference to restoring of the wideband gain.

12 Claims, 2 Drawing Sheets

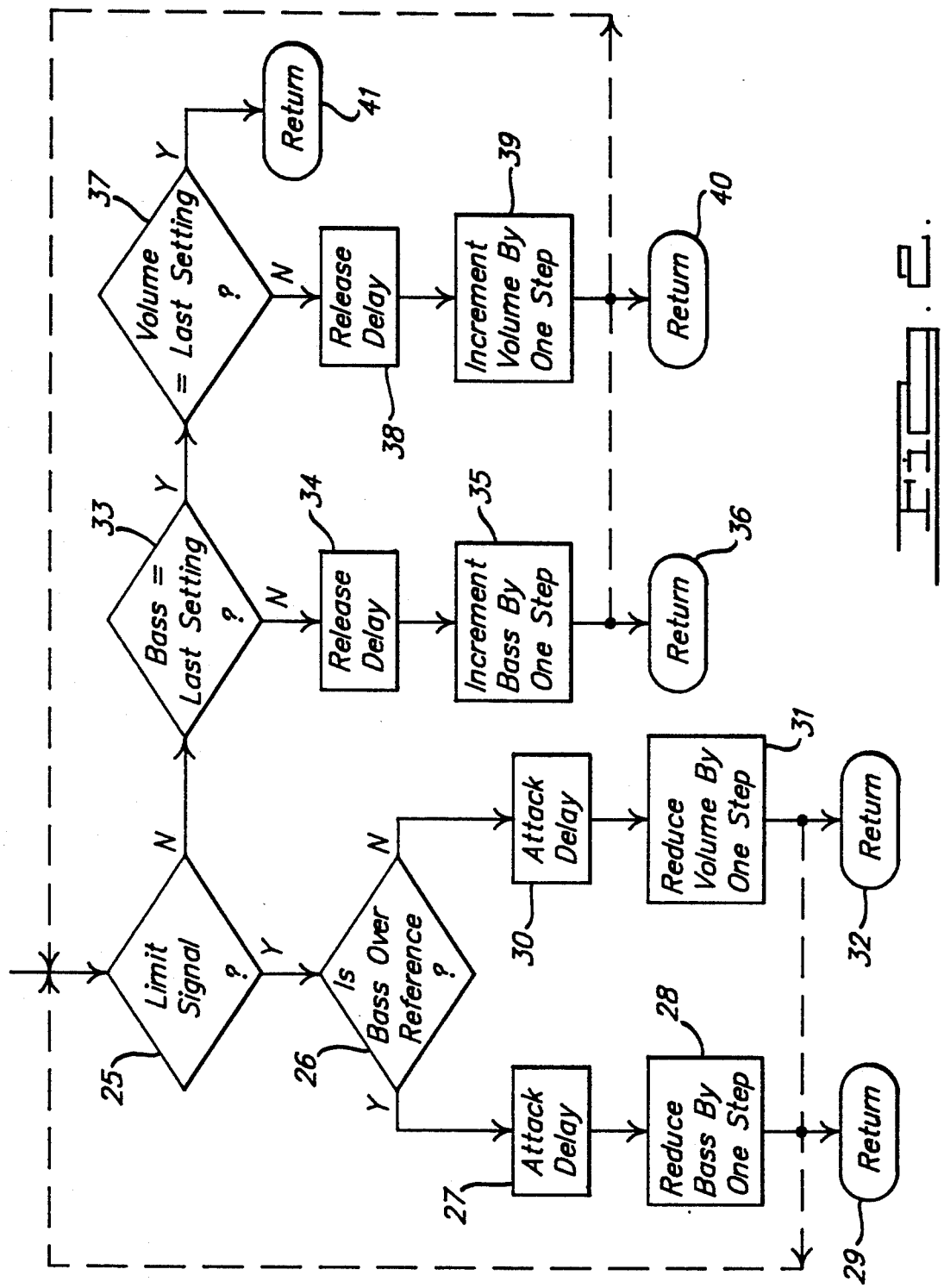

DIGITALLY CONTROLLED AUDIO AMPLIFIER WITH VOLTAGE LIMITING

BACKGROUND OF THE INVENTION

The present invention relates in general to audio systems which prevent distortion from amplifier clipping by employing gain limiting, and more specifically to automotive audio systems for separately limiting different frequency ranges in the audio spectrum.

Typical audio reproduction systems include a variable-gain amplification stage followed by a fixed-gain power amplifier which feeds an output transducer such as a speaker. A control voltage provided to the variable gain stage controls the output volume heard by a listener. The variable gain stage usually includes a tone control for varying the relative amplification of bass and/or treble frequency ranges.

An important objective in designing an audio system is to provide minimum distortion in signal reproduction. However, there is always some distortion, especially at high sound levels. As the magnitude of the signal provided from the variable gain amplifier stage to the power amplifier increases above a certain level, the power amplifier becomes overdriven. This situation occurs when the input signal to the power amplifier multiplied by the fixed gain of the power amplifier approaches the supply voltage level provided to the power amplifier. As a result, the power amplifier becomes saturated and signal peaks of the audio signal are distorted by clipping.

The problem of power amplifier clipping is more severe in automotive audio systems. Less voltage headroom (i.e., safety margin) is available to the power amplifier since the automobile is limited to a 12-volt electrical supply. Although a DC/DC converter can be used to obtain a higher DC voltage, such converters are relatively expensive. Also, bass boost is needed in the automotive environment to mask low frequency road and engine noise, making clipping more likely in the bass range of the audio signal.

It is known to employ voltage limiting or compression to the input of an amplifier to prevent clipping. In Evans et al, U.S. Pat. No. 4,048,573, a high fidelity audio amplifier compares the amplifier input to the amplifier feedback signal. The input signal is attenuated when any excessive signal in either the input or the feedback is detected. The resulting amplifier is wideband limited, i.e., even though the large amplitude signals causing limiting may be substantially only within a restricted range of frequencies, all frequencies are attenuated which results in a "breathing" effect. Thus, a loud bass signal can cause the reduction in volume of a quieter treble signal.

In Mestorovic, U.S. Pat. No. 4,233,566, the power amplifier output signal is compared to a predetermined reference. When the output signal exceeds the reference, a voltage controlled attenuator reduces the input signal to the power amplifier. This system is likewise subject to the breathing effects caused by its wideband approach.

Sondermeyer, U.S. Pat. No. 4,318,053, discloses an amplifier which reduces the amplifier gain when clipping reaches a certain threshold. A threshold detector charges a capacitor which may then be discharged into a variable gain amplifier according to the percent of clipping of the output signal of the amplifier. This system has the disadvantages that limiting is performed over the entire frequency range of the amplifier even upon the occurrence of a large amplitude signal of narrow frequencies.

The paper Noble et al, *A Dual-Band Audio Limiter*, Journal of the Audio Engineering Society, Vol. 17, No. 6, December 1969, pages 678–684, describes a limiting system in which the audio signal is split into separate paths for bass frequencies and higher frequencies. Gain in each path is reduced upon the occurrence of a peak level, the reduced gain being maintained for the recovery time of the limiter. Noble et al point out that recovery time should be short in order to minimize dynamic distortion. However, harmonic distortion and intermodulation distortion require a longer release time to minimize total distortion. Noble et al deals with these conflicting results by providing different release times in each path. Thus, distortion is reduced for bass frequencies by providing a longer release time, while distortion at higher frequencies is minimized by a short release time. However, the threshold for initiating limiting is the same in each band of frequencies.

The dual-band limiter in Noble et al has the problem that a phase splitter and band pass filters are required to separate the audio signal into separate bands and that the separate bands must be mixed together in the output. These elements add their own distortion to the signal and expense to the amplifier.

Commonly assigned U.S. Pat. No. 4,912,424, teaches a voltage limiting system wherein separate volume and tone (e.g., bass) control loops alter analog control voltages from the user inputs to separately reduce or restore the analog control voltages in proportion to separate time integrals during and following a clipping signal. The volume and bass control voltages are integrated and deintegrated simultaneously but in proportion to different integrals so that the bass control voltage is reduced at a lower threshold of clipping. When clipping falls below the threshold, the bass control voltage is restored to the user set level. The volume control voltage is reduced when clipping is above a higher threshold. Desired attack and release times for the separate control loops are achieved using analog RC circuits.

The use of microcontrollers to supervise the overall operation of audio systems has become popular due to their added flexibility in controlling an audio system. In connection with the use of microcontroller systems, audio processors have been introduced which accept digital rather than analog control signals to set the volume and tone levels. The analog control voltage to the audio processor used in previous systems is determined by the user by setting a potentiometer. In a digital system, the user sends control signals to a microcontroller via a keypad and the microcontroller then sends a digital command to the audio processor, usually using a serial bus. The digital signals carried by the serial bus are not amenable to integration and deintegration as were the analog signals. The digital control signals also share a single conductor connected between the microcontroller and the audio processor rather than having separate analog control circuits that can be separately controlled. Furthermore, a microcontroller takes each action in a serial manner rather than taking actions simultaneously. Thus, an acceptable limiting scheme has not yet been provided for the digitally controlled audio processor.

SUMMARY OF THE INVENTION

It is a principal object of the present invention to provide voltage limiting for an audio amplifier having digital control inputs to avoid clipping distortion without the perception of "breathing".

It is another object of the present invention to provide separate wideband (e.g., volume) control and narrowband (e.g., bass) control for separately limiting wideband and narrowband gain using a serially operating microcontroller.

These and other objects are achieved by a microcontroller controlled audio system including an interface circuit for connection between a microcontroller and a power amplifier for detecting clipping distortion in excess of a threshold. When clipping distortion exceeds the threshold, the microcontroller reduces the narrowband gain in predetermined steps after predetermined delays. If the narrowband gain is reduced to a predetermined reference level and if clipping distortion remains above the threshold, then wideband gain is reduced in similar predetermined steps after similar predetermined delays. When the interface circuit indicates that clipping distortion has fallen below the threshold, the wideband gain is restored according to predetermined steps including additional predetermined delays and then narrowband gain is restored using predetermined steps and predetermined delays. The attack and release times for limiting are controlled to any desired times by the predetermined delays.

BRIEF DESCRIPTION OF THE DRAWINGS

The novel features of the invention are set forth with particularity in the appended claims. The invention itself, however, both as to its organization and method of operation, together with further objects and advantages thereof, may best be understood by reference to the following description taken in conjunction with the accompanying drawings, in which:

FIG. 2 is a flowchart showing a preferred method of the present invention.

DETAILED DESCRIPTION OF PREFERRED EMBODIMENTS

Figure 1:
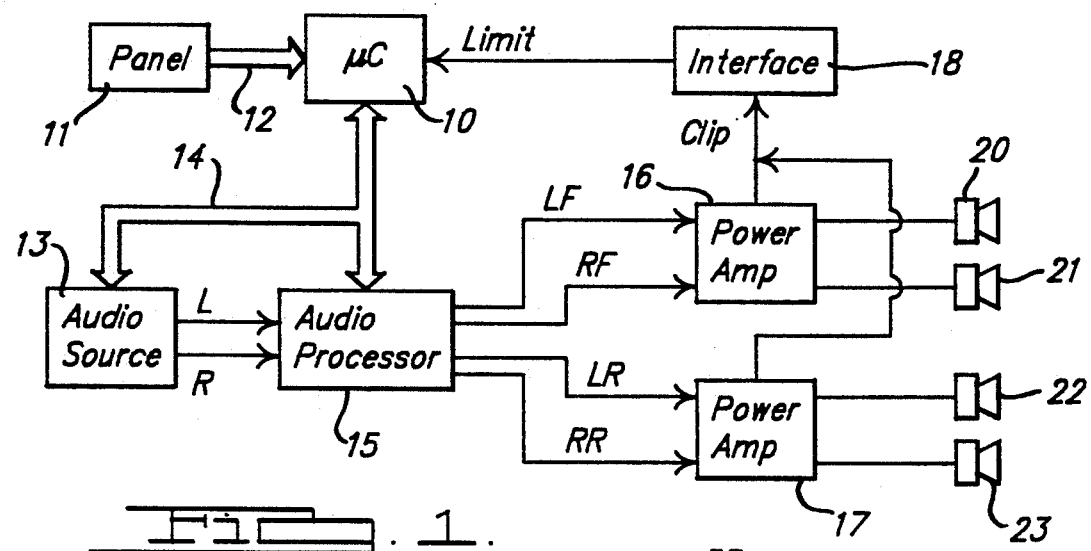
FIG. 1 is a block diagram showing a preferred embodiment according to the present invention.

FIG. 1 shows a microcontroller 10 connected to an input panel 11 over a plurality of input lines 12. An audio source 13, such as a radio, a cassette player or a CD player, is connected to microcontroller 10 over a bus 14. Left and right audio signals are provided from audio source 13 to an audio processor 15 which is also connected to microcontroller 10 over bus 14. Audio processor 15 may be comprised of a TDA7302 digitally controlled stereo audio processor integrated circuit available from SGS-Thomson Microelectronics. Left-front and right-front stereo outputs are connected to a power amplifier 16. Left-rear and right-rear stereo outputs are connected to a power amplifier 17. Power amplifiers 16 and 17 may each be comprised of a TDA7360 stereo/bridge amplifier with clipping detector integrated circuit, also available from SGS-Thomson Microelectronics. Amplified audio outputs from the power amplifiers are connected to front speakers 20 and 21 and rear speakers 22 and 23 as shown.

The clip detector outputs of power amplifiers 16 and 17 are connected to an interface circuit 18. A limit signal output line from interface 18 is connected to an input of microcontroller 10.

Microcontroller 10 supervises operation of the overall audio system based on operator inputs obtained by actuating switches on panel 11, for example. The resulting signals received by microcontroller 10 may correspond to up or down adjustments of volume or bass boost. Based on these user-defined settings, microcontroller 10 issues digital commands to audio processor 15 to determine the gain for the narrowband bass section in audio processor 15 and the gain for the wideband (i.e., volume) control section of audio processor 15.

power amplifiers 16 and 17 apply a fixed gain to the stereo audio signals. Power amplifiers 16 and 17 detect any clipping distortion (i.e., a difference between the input signal times the fixed gain and the actual output of the power amplifier) and generate a clip signal to indicate the onset of clipping. Interface circuit 18 integrates the clip signal to determine whether a predetermined threshold of clipping distortion is exceeded. In one embodiment of the invention, clipping distortion amounting to about 10% harmonic distortion is employed as the predetermined threshold since distortion below that threshold is not objectionable and sometimes not noticeable to the listener. When the predetermined threshold is exceeded, a limit signal is provided from interface 18 to microcontroller 10. In response to the limit signal, microcontroller 10 modifies the digital commands issued to audio processor 15 in order to reduce first the narrowband (e.g., bass) gain and then to reduce the wideband (e.g., volume) gain once the narrowband gain is reduced to a predetermined gain and if the limit signal persists.

The method employed by microcontroller 10 to alter the digital commands to the audio processor is shown in detail in FIG. 2. The method can be implemented either as a software subroutine which is called by the microcontroller on a periodic basis at predetermined intervals, or as an interrupt service routine triggered by the occurrence of the limit signal. Both alternatives will be described with reference to FIG. 2, but since clipping distortion can occur almost at any time that an audio signal is being produced, it is preferred to adopt the called subroutine implementation of the invention.

The method begins at step 25 where a check is made for the presence of the limit signal. If the limit signal is present, then the digital command currently in effect for the audio processor is compared to a predetermined reference level in step 26. In a preferred embodiment, a reference level of two steps in gain (about five dB) above detent was employed. Detent refers to the normal bass setting where there is no bass boost and no bass cut. Each step in gain in the audio processor used in the present embodiment is about 2.5 dB per step in the digital command.

If the bass digital command is over the reference level, then an attack time delay is implemented in step 27 and the bass digital command is reduced by one step in step 28. The attack delay in step 27 is relatively short (e.g., about 7.3 milliseconds) to allow a quick reduction in the bass gain. Following the bass gain reduction in step 28, the limiting subroutine is ended by executing a return to the main microcontroller (i.e., "calling") routine in step 29. Alternatively, if an interrupt service routine method is adopted, then the method proceeds directly back to step 25 since the audio system will then be in a limiting condition. In either case, step 25 is the next step in the limiting routine to be executed, whether or not control is temporarily transferred back to the main routine.

In step 26, if the bass digital command is not over the reference level, then the wideband volume gain is reduced instead. An attack time delay is implemented in step 30 which may preferably be equal to the attack delay of step 27, or about 7.3 milliseconds. In step 31, the volume digital command to the audio processor is reduced by one step and a return is made to the main routine in step 32. The test for the presence of the limit signal is then again made in step 25.

It can be seen that when clipping distortion exceeds the predetermined threshold and the limit signal is generated by the interface circuit, bass gain is first reduced to a reference level in preference to any reduction in the wideband gain (volume). Thus, the "breathing" effects of the prior art are avoided.

When clipping distortion falls below the predetermined threshold and the limit signal no longer persists, the decision in step 25 leads to a test in step 33 where the current bass digital command is compared to the input setting which was last made by the user through the control panel. If the bass digital command is less than the user input setting (indicating that bass limiting is in effect), then a release time delay is implemented in step 34. To minimize distortion of the audio signal, the release time delay is longer than the attack time delay and may be equal to about 500 milliseconds. Following the release time delay, the bass digital command is incremented by one step in gain in step 35. A return to the microcontroller main routine is made in step 36 in the event of a periodically called subroutine, or a direct jump to step 25 is made in the event of an interrupt-driven subroutine. Thus, after clipping distortion subsides, the bass digital command is more slowly restored to the original user setting.

Once the bass digital command is restored, the volume digital command is restored, if necessary. In step 37, the current volume digital command is compared to the volume input setting made by the user through the control panel. If the digital command is less than the input setting, then the release time delay is implemented in step 38 which again may equal the release time delay of step 34 (500 milliseconds). The volume digital command is then incremented by one step in gain in step 39 and a return to the main routine is executed in step 40, or a return to step 25 is made in the event of an interrupt service routine.

Due to the long (e.g., ½ second) release time implemented in steps 34 and 38, it may be desirable to alternatively start a release timer and then return to the main microcontroller routine in order to allow other controller actions to take place during the release time delay. On each return to the limiting subroutine, a check is made for the timing out of the release timer and the bass or volume can then be incremented by one step upon expiration of the timer.

In step 37, if the volume digital command does equal the last user input setting, then a return to the main routine of the microcontroller or a termination of the interrupt service routine can be implemented in step 41.

In an alternative embodiment of the method of FIG. 2, it may be desirable to include between step 26 and step 30 a test for checking whether the volume digital command is over a second reference level. For example, if the volume digital command corresponds to a gain of −4 dB (i.e., 4 dB of attenuation) or less, then no reduction or the volume digital command is implemented. Instead, a return is made to the main microcontroller routine.

Figure 3:
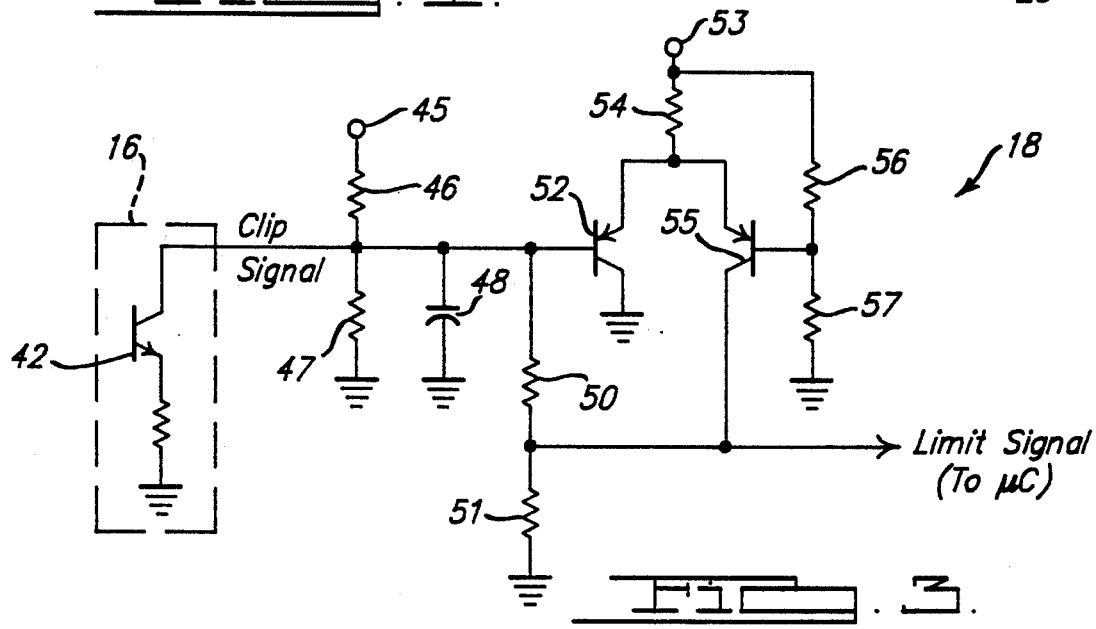
FIG. 3 is a schematic diagram showing the interface circuit of FIG. 1.

Interface circuit 18 is shown in greater detail in FIG. 3. Each power amplifier (e.g., power amplifier 16) includes a transistor 42 which is made conductive whenever clipping distortion is detected in the power amplifier. Transistor 42 provides a clip signal in the form of a current sink or a path to ground upon the occurrence of clipping. The clip signals from all the power amplifiers are connected in parallel (see FIG. 1) in a wired-OR configuration so that clipping in any one amplifier can initiate limiting. The clip signal is connected to a voltage divider comprised of a reference voltage terminal 45 and a pair of series connected resistors 46 and 47. The reference voltage and the resistance values of resistors 46 and 47 are selected to provide a relatively high DC voltage at the junction of resistors 46 and 47 (e.g., about +6 volts) when unaffected by the other components. A capacitor 48 is connected between the junction of resistors 46 and 47 and circuit ground. The junction point of resistors 46 and 47 is also connected to a further voltage divider comprised of series connected resistors 50 and 51. The junction of resistors 50 and 51 provides the limit signal which is output to the microcontroller. Resistor 50 has a relatively higher resistance value than resistor 51.

The junction of resistors 46 and 47 is further connected to the base of a transistor 52 for receiving the clip signal. Transistor 52 is a pNP transistor and has its collector connected to circuit ground. The emitter of transistor 52 is connected to a resistor 54 and the emitter of a second pNP transistor 55. The other side of resistor 54 is connected to a reference voltage terminal 53 and to one side of a resistor 56. The other side of resistor 56 is connected to the base of transistor 55 and to one side of a resistor 57. The other side of resistor 57 is connected to circuit ground. The collector of transistor 55 is connected to the junction between transistors 50 and 51 where the limit signal is provided.

In operation, when there is no clipping in the power amplifier, then the clip signal does not provide a current path to ground. Then the junction of resistors 46 and 47 provides a DC voltage of about 6 volts. Capacitor 48 is charged to 6 volts and transistor 52 is made conductive. Since resistor 50 is relatively greater than resistor 51, the 6 volts from the junction of resistors 46 and 47 is further divided across resistor 51 to a lower voltage of about 0.3 volts which corresponds to a low logic level (i.e., the absence of a limit signal).

The voltage divider formed by resistors 56 and 57 provides a sufficient base voltage to transistor 55 to render it conductive. Since resistor 52 is conductive, however, all current flow through resistor 54 is shunted to ground through transistor 52 thereby preventing transistor 55 from conducting.

When clipping distortion does occur and transistor 42 in the power amplifier 16 does provide a current sink, the voltage stored on capacitor 48 is deintegrated in proportion to the amount time that the clipping signal occurs. When the clipping signal provides a current sink for a time sufficient to deintegrate the capacitor voltage to below the point where transistor 52 is conductive, then transistor 52 turns off and transistor 55 then conducts current from reference voltage terminal 53 through resistor 54, transistor 55, and resistor 51 to circuit ground. Resistor 51 is selected to have a resistance sufficiently high with respect to the resistance of resistor 54 so that the limit signal voltage rises to a high logic level (e.g., +4 volts).

When clipping distortion subsides and the clip signal no longer provides a current sink, capacitor 48 reintegrates the reference voltage and rises to 6 volts after a time depending on a RC time constant of resistor 47 and capacitor 48. Transistor 52 again turns on and the limit signal is reduced to the low logic level.

Figure 4:
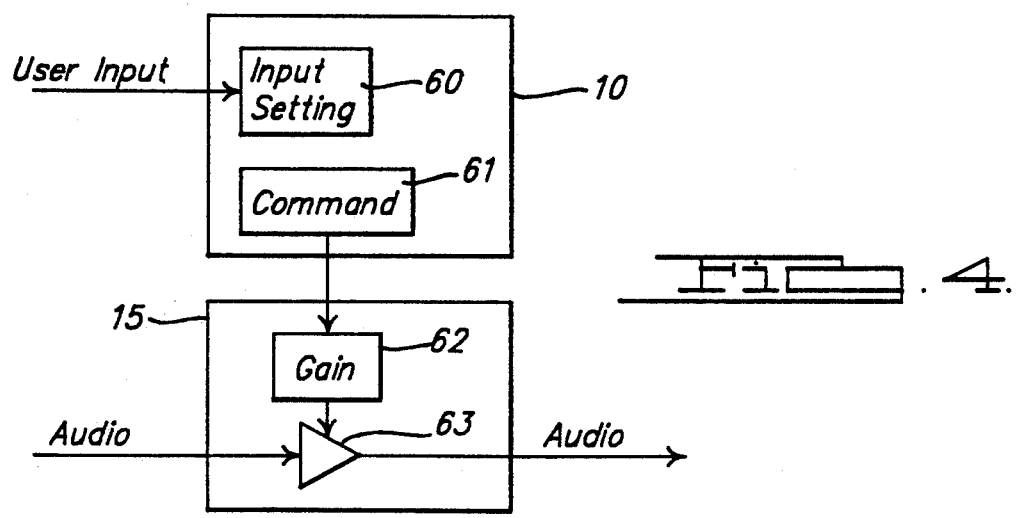
FIG. 4 is a block diagram illustrating the control variables employed in the invention of FIG. 1.

FIG. 4 shows the internal memory storage of microcontroller 10 and audio processor 15 associated with the gain control function. The user input setting for a gain (either wideband or narrowband gain) is stored at a memory location 60 in microcontroller 10. Employing the method described with reference to FIG. 2, microcontroller 10 generates a digital command which is stored in a memory location 61. Whenever a digital command is updated, it is transmitted to audio processor 15 over a seral bus and is stored at a gain control memory location 62 in audio processor 15. The gain setting is applied to an amplifier 63 which amplifies the audio signal with the commanded gain. Alternatively, a variable attenuator can be employed in audio processor 15 whereby the digital command in fact sets the attenuation applied to the audio signal rather than a gain. In the method of the present invention, a reduction in gain is equivalent to an increase in attenuation and an increase in gain is equivalent to a reduction in attenuation.

While preferred embodiments of the invention have been shown and described herein, it will be understood that such embodiments are provided by way of example only. Numerous variations, changes, and substitutions will occur to those skilled in the art without departing from the spirit of the invention. Accordingly, it is intended that the appended claims cover all such variations as fall within the spirit and scope of the invention.

What is claimed is:

1. An audio system comprising:
   microcontroller means for controlling operation of said audio system by generating digital commands in response to sensed inputs;
   digitally-controlled audio processor means coupled to said microcontroller means for controlling a narrowband audio gain and a wideband audio gain of audio signals in response to said digital commands from said microcontroller means; wherein said digital commands comprise a wideband command signal and a narrowband command signal;
   power amplifier means coupled to said audio processor means for amplifying said audio signal;
   clip detect means coupled to said audio amplifier means for generating a clip signal indicative of the occurrence of clipping in said power amplifier means; and
   interface means coupling said clip detect means with said microcontroller means for integrating said clip signal and for transmitting a digital limit signal to said microcontroller means when said integration indicates that clipping distortion exceeds a threshold;
   said microcontroller means sensing said limit signal and altering said narrowband digital command to gradually reduce said narrowband gain while said limit signal is present until a predetermined narrowband gain is reached and altering said wideband command signal while simultaneously maintaining said narrowband command signal to gradually reduce said wideband gain if said limit signal persists.

2. The system of claim 1 wherein said microcontroller means further gradually alters said digital commands after the cessation of said limit signal to restore said narrowband gain to its original, non-altered value prior to restoring said wideband gain.

3. The system of claim 1 wherein said narrowband gain and said wideband gain are altered in step changes of gain, each step change reduction in gain following a respective time delay corresponding to a predetermined attack time.

4. The system of claim 2 wherein said narrowband gain and said wideband gain are altered in step changes of gain, each step change reduction in gain following a respective time delay corresponding to a predetermined attack time and each step change restoration in gain following a respective time delay corresponding to a predetermined release time.

5. The system of claim 1 wherein said threshold is about 10 percent harmonic distortion.

6. The system of claim 1 wherein said narrowband gain is a bass gain.

7. The system of claim 1 wherein said microcontroller means senses said limit signal at Predetermined intervals.

8. The system of claim 1 wherein said limit signal provides an interrupt for said microcontroller means.

9. A method for limiting clipping distortion in an audio system having a microcontroller for digitally controlling a bass gain and a wideband volume gain in an audio processor in steps according to bass and volume digital commands based on operator input settings for bass and volume, said method comprising the steps of:
   detecting the occurrence of clipping in said audio system;
   generating a limit signal when clipping . distortion exceeds a threshold; and
   recurrently executing the steps of:
   checking for the occurrence of said limit signal;
   if said limit signal is present then checking whether said bass digital command is above a predetermined reference command level and if so then waiting for a first predetermined delay and then reducing said bass digital command by at least one step, but if said bass digital command is not above said predetermined reference command level then waiting for a second predetermined delay and then reducing said volume digital command by at least one step; and
   if said limit signal is not present then checking whether said bass digital command corresponds to said bass input setting and if not then waiting for a third predetermined delay and then increasing said bass digital command by at least one step, but if said bass digital command corresponds to said bass input setting then checking whether said volume digital command corresponds to said volume input setting and if not then waiting for a fourth predetermined delay and then increasing said volume digital command by at least one step.

10. A method for limiting clipping distortion in an audio system having a microcontroller for digitally controlling a bass gain and a wideband volume gain in an audio processor in steps according to bass and volume digital commands based on operator input settings for bass and volume, said method comprising the steps of:

detecting the occurrence of clipping in said audio system;

generating a limit signal when clipping distortion exceeds a threshold; and gradually reducing said bass digital command in response to said limit signal and then gradually reducing said volume digital command if said bass digital command has been reduced to a predetermined value, and said limit signal persists, and simultaneous to reduce said volume digital command, while maintaining said bass digital command.

11. The method of claim 10 further comprising the steps of:

increasing said bass digital command if said bass digital command does not correspond to said bass input setting and said limit signal is not present; and increasing said volume digital command if said volume digital command does not correspond to said volume input setting, said bass digital command does correspond to said bass input setting, and said limit signal is not present.

12. The method of claim 10 wherein said limit signal causes an interrupt in said microcontroller.

* * * * *